US009118311B1

(12) United States Patent
Lancaster et al.

(10) Patent No.: US 9,118,311 B1
(45) Date of Patent: Aug. 25, 2015

(54) METHODS AND APPARATUS FOR GENERATING A MODULATED WAVEFORM

(71) Applicants: Mark A. Lancaster, Scottsdale, AZ (US); Chongli Wu, Queen Creek, AZ (US)

(72) Inventors: Mark A. Lancaster, Scottsdale, AZ (US); Chongli Wu, Queen Creek, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 63 days.

(21) Appl. No.: 14/199,724

(22) Filed: Mar. 6, 2014

(51) Int. Cl.
*H03L 7/06* (2006.01)
*H03K 5/159* (2006.01)
*H03K 7/08* (2006.01)
*H03L 7/08* (2006.01)

(52) U.S. Cl.
CPC .................. *H03K 5/159* (2013.01); *H03K 7/08* (2013.01); *H03L 7/08* (2013.01)

(58) Field of Classification Search
USPC .................................. 327/147–149, 156–159
See application file for complete search history.

(56) References Cited

U.S. PATENT DOCUMENTS

| 5,101,117 | A  | * | 3/1992 | Johnson et al. | 327/149 |
| 7,117,384 | B2 | * | 10/2006 | Chen et al. | 713/600 |
| 7,250,740 | B2 |  | 7/2007 | Katsuki et al. | |
| 7,551,011 | B2 | * | 6/2009 | Paull | 327/156 |
| 7,675,332 | B1 | * | 3/2010 | Kwasniewski et al. | 327/158 |
| 8,779,812 | B1 | * | 7/2014 | Kavanagh et al. | 327/150 |
| 2010/0218025 | A1 | * | 8/2010 | Saito | 713/324 |
| 2011/0084749 | A1 |  | 4/2011 | Mienkina et al. | |
| 2012/0013376 | A1 | * | 1/2012 | Thacker et al. | 327/156 |

* cited by examiner

*Primary Examiner* — Adam Houston
(74) *Attorney, Agent, or Firm* — Quarles & Brady LLP

(57) ABSTRACT

A system and method are present for generating a modulated waveform. A timer is configured to generate a first modulated waveform signal, and an adder module is configured to calculate a delay. The delay includes at least one of an edge fractional delay and a dead time fractional delay. A delay module is operably coupled to the timer and the adder module. The delay module is configured to delay at least one of a rising edge of the first modulated waveform signal and a falling edge of the first modulated waveform signal by the delay to generate a second modulated waveform signal that has a higher frequency resolution than a frequency resolution of the first modulated waveform signal.

20 Claims, 5 Drawing Sheets

US 9,118,311 B1

METHODS AND APPARATUS FOR GENERATING A MODULATED WAVEFORM

FIELD OF THE INVENTION

The field of this invention relates to a method and apparatus for generating a modulated waveform signal.

BACKGROUND OF THE INVENTION

It is known for microcontrollers and the like to be used to drive, by way of example, switch mode power supplies, resonant converters, induction heaters, etc, whereby the microcontroller is required to generate a high frequency modulated signal waveform. Such modulated waveform signals are required to comprise a precise frequency resolution, for example in the range of 11 to 14 bits resolution at a frequency of approximately 100 Kilohertz (Khz) to 1 megahertz (Mhz). In addition, suitable microcontrollers are typically required to be highly integrated, in order to provide reliable and low-cost solutions, whilst also being flexible in their operation and architecture.

In order to keep both costs and power consumption down to acceptable levels, semiconductor devices comprising microcontrollers are often required to use slower operating clock speeds, and slower, less expensive components. However, a problem with existing microcontroller architectures is that such restrictions on the operating clock speeds have the detrimental effect on the microcontrollers in that they are incapable of generating modulated signal waveforms comprising high enough frequencies, whilst also providing high enough frequency resolution for minimizing output voltage ripple and, thus, also noise levels, as required for switched mode power supplies utilized in the telecommunication industry.

Typically, current on-chip timers and PWM (Pulse Width Modulation) modules are able to achieve a maximum frequency resolution of less than 10 bits, for a 100 kHz waveform. As will be appreciated, for existing applications where a frequency resolution of 11 to 14 bits is required for up to a 1000 kHz waveform, these current on-chip timers and PWM modules are inadequate.

To overcome this problem, whilst maintaining costs and power consumption down to acceptable levels, it is known for on-chip timers and PWM modules to be operably coupled to an external digital to analogue converter (DAC) and voltage controlled oscillator (VCO). FIG. 1 illustrates an example of such a known solution comprising a microcontroller 100 to generate a high frequency modulated waveform signal comprising a high resolution. The microcontroller 100 comprises an on-chip timer 110 arranged to generate a modulated waveform signal.

As previously mentioned, in order to keep costs and power consumption down to an acceptable level, semiconductor devices (microcontrollers) are required to use slower operating clock speeds, and slower, less expensive components. Accordingly, the timer 110 is capable of generating, say, a "coarse" 100 kHz modulated waveform ($MW_{rough}$) comprising a resolution of less than 10 bits. The coarse modulated waveform ($MW_{rough}$) is then provided to an external digital to analog converter (DAC) 120 and voltage controlled oscillator (VCO) 130. In this manner, the external DAC 120 and VCO 130 are able to refine the coarse modulated waveform ($MW_{rough}$) into high-frequency modulated waveform ($MW_{fine}$) of, say, up to 1000 kHz comprising a resolution of 11 to 14 bits.

A problem with this approach is that there is a need to use external components to refine the on-chip generated modulated waveform. The resolution of the high-frequency generated waveform ($MW_{fine}$) is generally equal to the resolution of the timer modulated waveform ($MW_{rough}$). The higher resolution of the modulated waveform ($MW_{fine}$) may be achieved by lowering the frequency of the timer generated coarse modulated waveform ($MW_{rough}$), which increases the resolution thereof. The frequency level of the coarse modulated waveform ($MW_{rough}$) determines smoothing factors of the external digital-to-analogue converter (DAC) and voltage controlled oscillator (VCO); the higher the smoothing factor the longer the settling time and slower dynamic response of the system. Thus, the chain of components and the characteristics of such a semiconductor device result in reduced reliability, increased system costs and worse dynamic response in comparison to fully integrated systems.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In the following disclosure, examples will be described in terms of a system-on-chip (SoC) microcontroller comprising integrated timer logic and delay logic. Although examples of the invention will be described in terms of such a system-on-chip (SoC) microcontroller, it will be appreciated that the inventive concept herein described may be embodied in any apparatus that incorporates timer logic and delay logic arranged to generate a modulated waveform signal.

Figure 1:
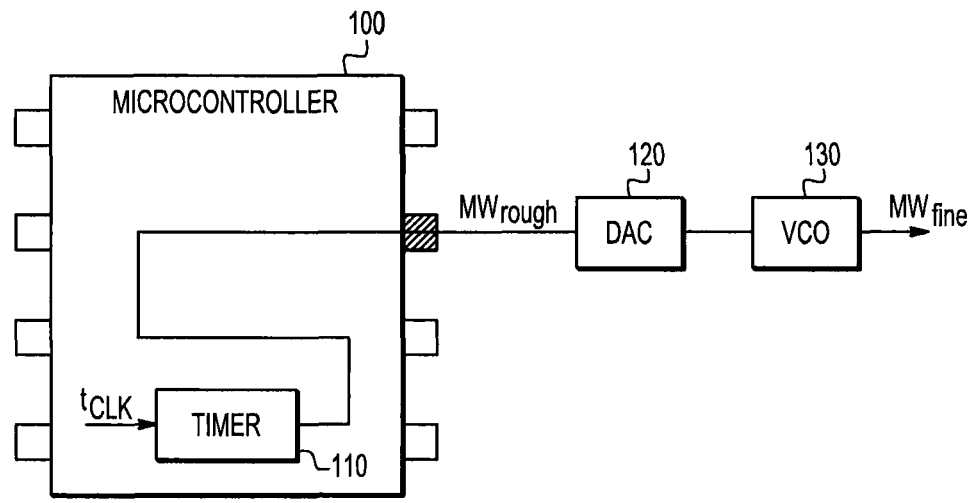
FIG. 1 illustrates an example of a conventional solution configured to generate a high frequency modulated waveform signal comprising a high resolution.
Figure 2:
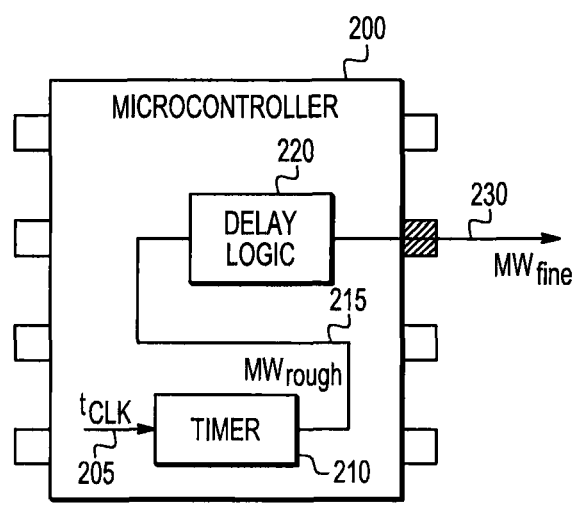
FIG. 2 illustrates an example of a semiconductor device according to some embodiments of the present disclosure.

Referring now to FIG. 2, there is illustrated an example of a semiconductor device 200 adapted according to some embodiments of the invention, which for the illustrated example comprises a system-on-chip (SoC) signal processing logic in the form of a microcontroller. The semiconductor device 200 further comprises timer logic 210 for generating a first modulated waveform signal ($MW_{rough}$) 215 and delay logic 220, operably coupled to the timer logic 210 and arranged to generate a second, refined modulated waveform signal ($MW_{fine}$) 230. In particular, the delay logic 220 is arranged to cause a first delay in a rising edge of the first modulated waveform signal ($MW_{rough}$) 215, and a second delay in a falling edge of the first modulated waveform signal ($MW_{rough}$) 215, such that the resulting second, refined modulated waveform signal ($MW_{fine}$) 230 comprises at least a higher pulse width resolution than that of the first modulated waveform signal ($MW_{rough}$) 215. As described herein, the first and second delays can optionally be selected to incorporate a delay of a fraction of a clock cycle of the first modulated waveform signal ($MW_{rough}$), where the delay is selected to both generate the desired refined waveform, and also to implement dead time delays where the dead time delay is on the order of a fraction of the clock cycle of the first modulated waveform signal ($MW_{rough}$).

The delay logic 220 may for instance be further arranged to cause first and second delays in the rising and falling edges respectively of the first modulated waveform signal ($MW_{rough}$) 215 such that the resulting second, refined modulated waveform signal ($MW_{fine}$) 230 comprises a higher pulse width resolution than that of the first modulated waveform signal generated by the timer logic 210.

In this manner, by delaying each of the rising and falling edges of the first modulated waveform signal ($MW_{rough}$) 215, the resulting second, refined modulated ($MW_{rough}$) waveform signal ($MW_{fine}$) 230 may be provided with a greater frequency resolution and improved dead time resolution, as well as a greater pulse width resolution. Accordingly, a high frequency modulated waveform signal, for example in the range of up to 1000 kHz with, say, a 7-bit pulse width resolution, generated by the on-chip timer 210 of the microcontroller 200 can be refined by the delay logic 220 to provide a greater resolution, for example a 11 to 14 bit resolution. Thus, a low cost, reliable, integrated on-chip system may be provided that is capable of generating a high resolution modulated waveform signal.

Figure 3:
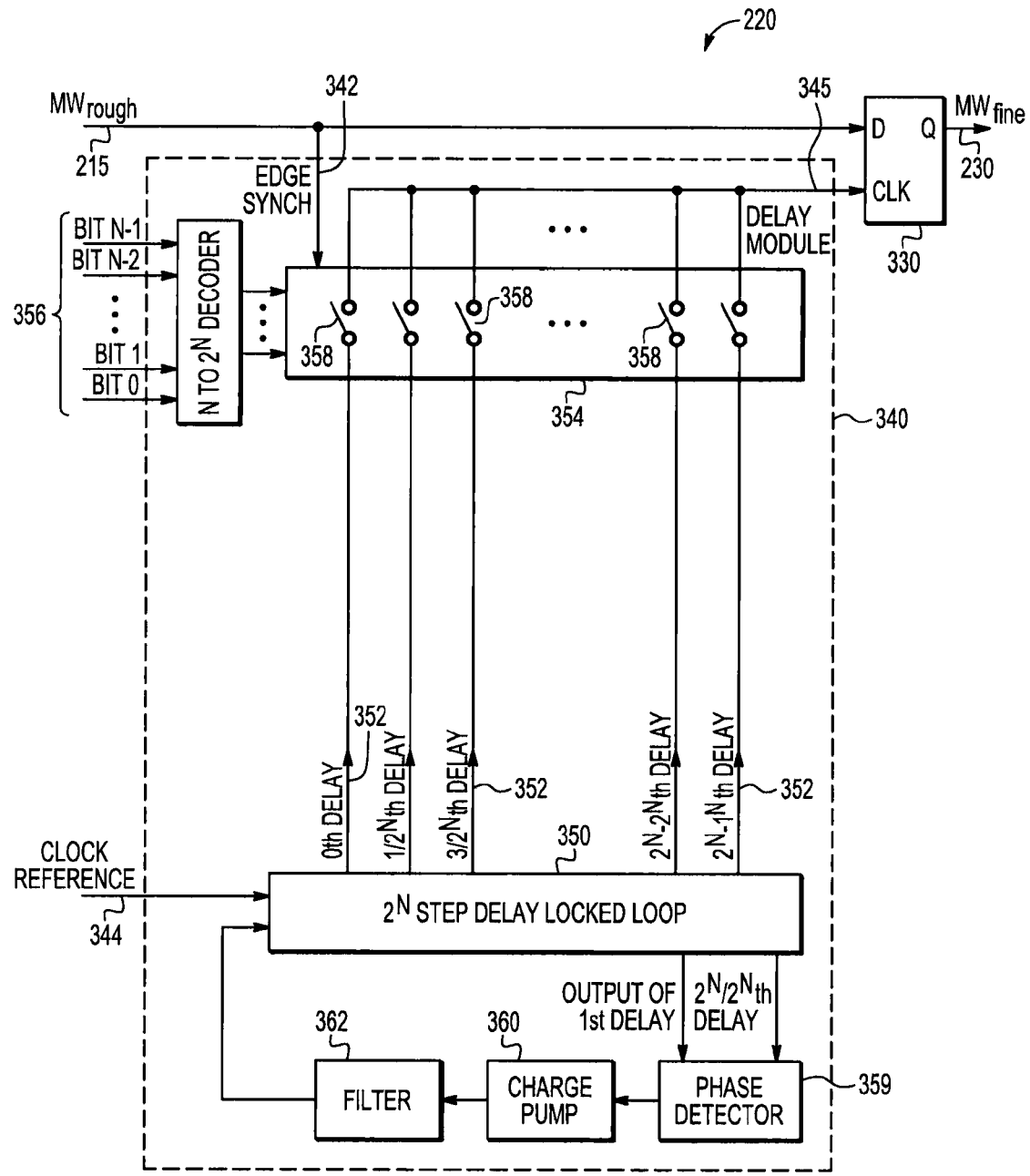
FIG. 3 is a block diagram illustrating an embodiment of delay logic in accordance with the present disclosure.

Referring now to FIG. 3, there is illustrated, in greater detail, an example of delay logic 220. The delay logic 220 is operably coupled to, and arranged to receive, a first modulated waveform signal (e.g., $MW_{rough}$) 215. The delay logic 220 is arranged to cause a first delay in a rising edge of the first modulated waveform signal ($MW_{rough}$) 215, and a second delay in a falling edge of the first modulated waveform signal ($MW_{rough}$) 215, such that the resulting second, refined modulated waveform signal ($MW_{fine}$) 230 comprises at least a higher pulse width resolution than that of the first modulated waveform signal ($MW_{rough}$) 215.

For the example illustrated in FIG. 3, the delay logic 220 is coupled to a flip-flop 330, which receives, as an input on a data D port thereof, the first modulated waveform signal ($MW_{rough}$) 215. The delay logic 220 further comprises a delay module 340, which also receives as an input an edge sync signal 342 that identifies the edges in $MW_{rough}$ signal 215, and a clock signal 344 that is the same clock signal as that used by the timer in generating the $MW_{rough}$ signal 215. Delay logic 220 also includes an output coupled to a clock CLK port of the flip-flop 330. In this manner, for each triggering edge, for example each rising edge, of the signal received by the CLK port of the flip-flop 330, the flip-flop 330 samples the signal present at the D port thereof, and outputs the sampled signal.

The delay module 340 is arranged to output a clocking signal ($td_x$) 345 comprising a triggering edge for each rising and falling edge received at its input 342, and thus for each rising and falling edge of clock signal 344. More particularly, the delay module 340 is arranged to output a triggering edge after a first delay period ($td_1$) upon receipt of a rising edge of the first modulated waveform signal ($MW_{rough}$) 215 and to output a triggering edge after a second delay period ($td_2$) upon receipt of a falling edge of the first modulated waveform signal ($MW_{rough}$) 215.

In this manner, the delayed triggering edges output by the delay module 340 cause the flip-flop 330 to sample and output the signal at the D port thereof at delays of ($td_1$) and ($td_2$) following the rising and falling edges of the first modulated waveform signal ($MW_{rough}$) 215.

Accordingly, the rising and falling edges of the signal output by the flip-flop 330 will be delayed by ($td_1$) and ($td_2$) respectively in relation to the corresponding rising and falling edges of the first modulated waveform signal ($MW_{rough}$) 215. In this manner, by controlling the duration of the delays ($td_1$) and ($td_2$) the frequency and pulse width of the first modulated waveform signal ($MW_{rough}$) 215 may be modified to create a second, refined modulated waveform signal ($MW_{fine}$) 230 comprising higher frequency and/or pulse width resolutions therefor.

In the example depicted in FIG. 3, delay module 340 is implemented using a delay locked loop (DLL) 350. In the present example, DLL 350 includes a number of delay gates. In one embodiment, 16 delay gates are used, though any appropriate number of gates may be used. The delay gates are connected in series and each is configured to delay an input signal from being passed onto the next delay gate by a predetermined period of time (e.g., the delay gates each implement the same delay). Each delay gate may include one or more delay elements coupled in series, where the cumulative delay through the delay gate is the sum of the delays imposed by each of the elements. In an alternate embodiment, some or all of the delay gates may implement different delays from each other. In the present system the delay of each gate is approximately equal to the period of clock 344 divided by the number of gates.

DLL 350 includes a number of outputs 352 that are each connected to the outputs of one of the delay gates contained within DLL 350. DLL 350 also receives an input clock signal 344, which is flowed through the delay gates within DLL 350. Accordingly, the first output 352 of DLL 350 would match that of the clock signal 344 having been delayed by a period of time equal to the delay of one delay gate in DLL 350. Similarly, the fifth output 352 of DLL 350 would match that of the clock signal 344 having been delayed by a period time equal to five times the delay of one delay gate in DLL 350 (assuming all gates implement the same delay).

A multiplexer 354 is connected to the outputs 352 of DLL 350. The multiplexer 354 is configured to generate an output that is equal to one of the outputs 352 of DLL 350. The particular output 352 of DLL 350 that is selected by multiplexer 354 is determined by the value of input signal 356. In signal 356 is an N-bit binary value, where the number of gates in DLL 350 is equal to $2^N$ (e.g., N=1 to 10 or more). In one example, where DLL 350 has 16 delay gates, input signal 356 may have 16 potential values, enabling any one of the outputs 352 of DLL 350 to be selected. Depending upon the value of input signal 356, one of the gates 358 of multiplexer 354 closes, allowing the corresponding output 352 of DLL 350 to be read.

Accordingly, the delay of the clock signal 344 imposed by delay module 340 can be determined by the input signal 356 to multiplexer 354. If the input signal 356 has a value of '1' (e.g., a binary value of 0001), then the delay imposed by delay module 340 will be equal to the delay of a single delay gate in DLL 350. Similarly, if the input signal 356 has a value of '12' (e.g., a binary value of 1100), then the delay imposed by delay module 340 will be equal to the delay of 12 of the delay gates within DLL 350.

Generally, delay module 340 is configured so that the clock signal 344 can be delayed by a desired fraction of the clock period of the input signal. Accordingly, in one embodiment, the sum of the delays imposed by the delay gates of DLL 350 is equal to one period of the input clock signal 344.

In some embodiments, to provide for accurate operation of DLL 350, a feedback control loop including phase detector 359, charge pump 360, and filter 362 is provided to monitor the operation of DLL 350 and reset DLL 350 at the completion of a cycle. Phase detector 359 monitors the output of the first delay gate of DLL 350 and the last delay gate of DLL 350. During operation, the duration of time between the signal output from the first delay gate and the signal output from the last delay gate of DLL 350 is detected by phase detector 359 and communicated to charge pump 360. The output of charge pump 360 is an analog voltage signal which is proportional to the duration of time between the signal output from the first delay gate and the signal output from the last delay gate of DLL 350. This analog voltage signal (including some noise) is transmitted via filter 362 as a feedback signal to DLL 350. Inside DLL 350, a circuit compares a reference signal converted from clock reference 344 to the signal received from filter 362 and if there is an error, DLL 350 will adjust the delay duration of each delay gate in DLL 350 to reduce that error.

Figure 4:
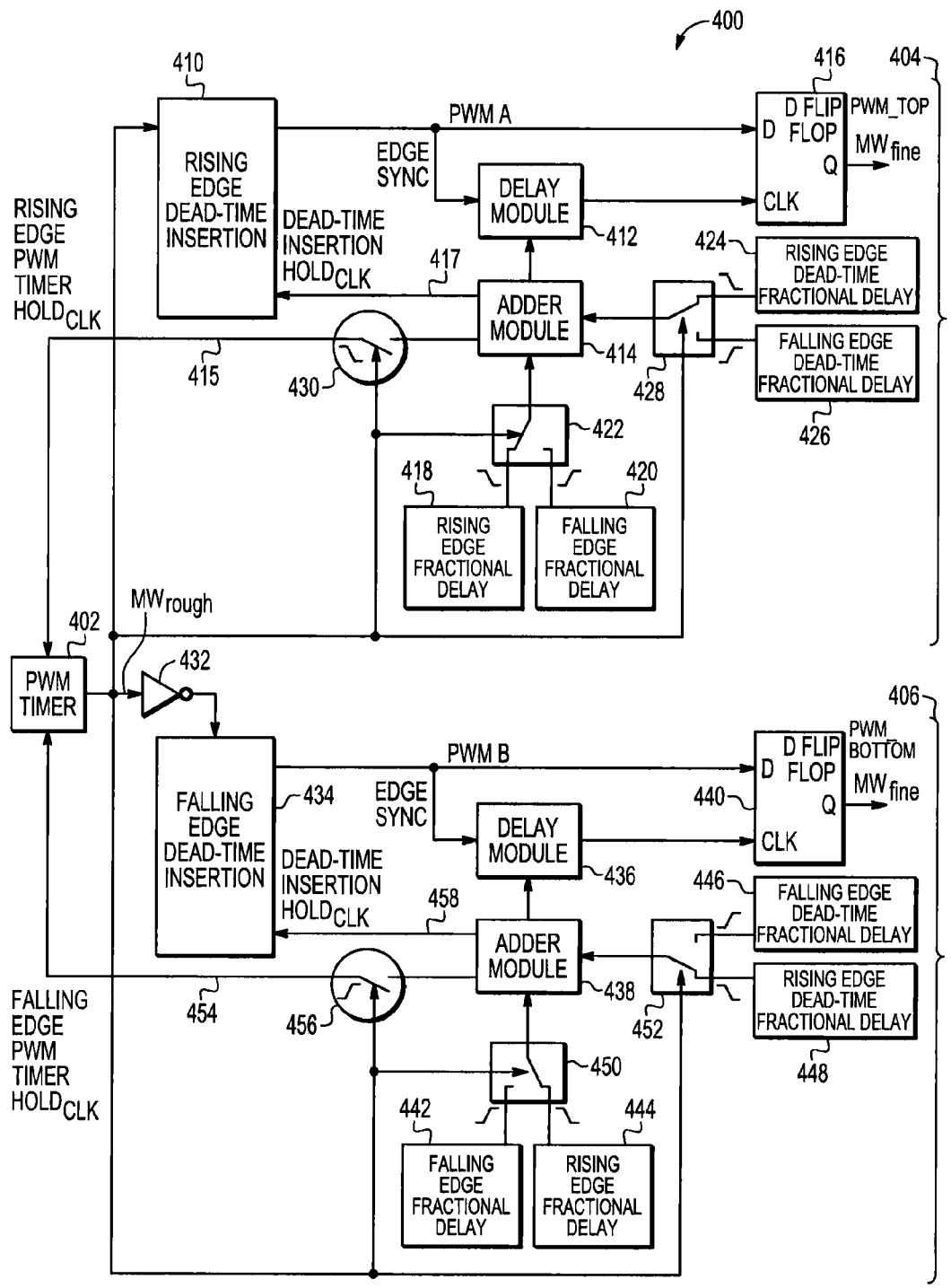
FIG. 4 is a block diagram illustrating a semiconductor device configured to implement a fractional delay of a waveform signal in accordance with the present disclosure.

FIG. 4 is a block diagram illustrating a PWM module 400 that may be used, for example, to drive a switch-mode power supply. PWM module 400 generates two complementary output signals PWM_Top and PWM_Bottom. In some embodiments, the output signals PWM_Top and PWM_Bottom may be used to drive complementary transistors in a switched-mode power supply. As such, PWM module 400 is configured to not only generate suitable PWM output signals having a desired frequency resolution, but also to implement dead time protection timing to reduce the risk of damage to the output device that may result from both complementary transistors being conductive at the same time because the time period required to turn-on a transistor can be faster than the time period required to turn-off a transistor.

As described above, PWM module 400 can provide improved frequency and dead time timing resolution over conventional devices. Specifically, PWM module 400 includes a first set of components that generate the complementary PWM signals, where the resolution of those complementary PWM signals is that same as that of a system clock—these signals are analogous to the $MW_{rough}$ signal described in conjunction with FIG. 2. PWM module 400 then provides delay modules that are configured to inject delays of fractions of a clock cycle (referred to herein as fractional delays) into the complementary PWM signals to generate refined signals—these signals are analogous to the $MW_{fine}$ signals described above in conjunction with FIG. 2. The delays introduced by the delay modules may include delays configured to provide dead time protection as well as arbitrary fractional delays selected based upon a desired system operation.

For example, given a particular clock frequency, the signal $MW_{rough}$ has a frequency resolution that cannot exceed that of the clock frequency. However, by introducing fractional delays to the $MW_{rough}$ signal, the frequency resolution of the $MW_{rough}$ signal can be increased to the same frequency resolution as that of the fractional delays. With reference to the delay logic 220 of FIG. 3, for example, where DLL 350 includes N delay gates, the resolution of the $MW_{rough}$ signal can be increased to $\frac{1}{2}^N$ that of the clock frequency 344.

Figure 5:
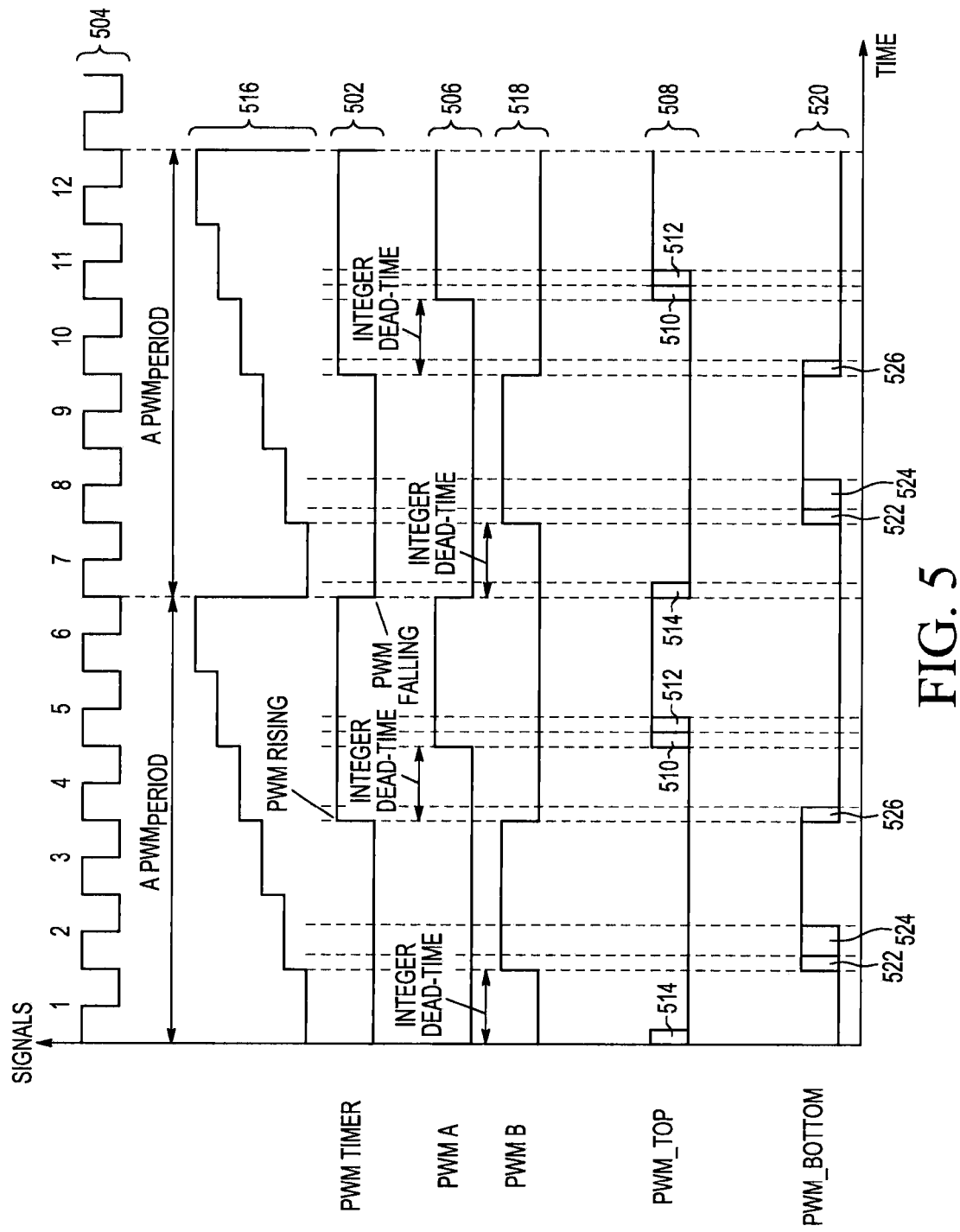
FIG. 5 is a simplified timing chart for the semiconductor device of FIG. 4.

PWM module 400 includes PWM timer 402 configured to generate a modulated waveform. With reference to FIG. 5, which illustrates a simplified timing chart for PWM module 400, the output of PWM timer 402 is represented by waveform 502. PWM timer 402 uses a counter (illustrated by waveform 516) to modulate its output over a PWM period. As illustrated by FIG. 5, the resolution of the output of PWM timer 402 does not exceed that of the system clock, illustrated by waveform 504. As such, the output of PWM timer 402 can only change state at the time same time the system clock changes state. The frequency resolution of PWM timer 402, therefore, is constrained by that of the clock signal 504.

The output of PWM timer 402 is supplied to two separate circuit branches (illustrated by braces 404 and 406). Branch 404 generates the output signal PWM_Top, while branch 406 generates the output signal PWM_Bottom.

Referring to branch 404, rising edge dead time insertion logic 410 is configured to detect the rising edge in the signal received from PWM timer 402 and insert a dead time delay. The dead time delay inserted by logic 410 has a frequency resolution that is equal to that of the system clock. The output of logic 410 is shown in FIG. 5 by waveform 506. As illustrated, the rising edges in waveform 506 are delayed by a fixed number of system clock cycles (in this example, 1 whole clock cycle). In addition to the whole-clock cycle delay introduced by insertion logic 410, however, branch 404 includes delay module 412, which is configured to add fractional delays to the signal received from insertion logic 410. In one embodiment, delay module 412 is configured as illustrated by delay module 340 shown in FIG. 3. Delay module 412 receives as an input a binary value from adder module 414 (which is analogous to the input 356 shown in FIG. 3). Delay module 412 also has an edge sync input enabling delay module 412 to detect edges in the signal outputted by insertion logic 410 and delay those edges by a fractional period.

Specifically, before an edge is detected, delay module 412 supplies a low value to the clock input of flip-flop 416 (which is analogous to the flip-flop 330 shown in FIG. 3), causing the output Q of flip-flop 416 to stay unchanged. When an edge is detected, delay module 412 executes a delay of a period determined by the value received from adder module 414. After that fractional delay period has expired, delay module 412 outputs a high value to the clock input of flip-flop 416 allowing the output Q of flip-flop 416 to change, representing a delay of the output of insertion logic 410. Because the delay value received from adder module 414 specifies a fractional delay, delay module 412 operates to impose a sub-clock-cycle delay to the signal received from insertion logic 410.

The delay value generated by adder module 414 is determined by a number of input values including an edge fractional delay, a dead time fractional delay, and a remainder from a previous delay. The input values are each specified as binary values having N-bits. In the present embodiment, different fractional delays and dead time fractional delays may be specified depending upon whether the PWM signal received from PWM timer 402 is at a rising or a falling edge.

In the example shown in FIG. 4, two different fractional delays 418 and 420 are defined for whether the PWM signal is at a rising edge or a falling edge, respectively. Similarly, two different fractional dead time delays 424 and 426 are defined for whether the PWM signal is at a rising edge or a falling edge, respectively. These delays are generally defined as binary values having N bits. The delays may be stored in registers or other memory structures accessible to PWM module 400. The delay values may be static or may be dynamic, varying in accordance with the operating conditions of PWM module 400. For example, the performance of transistors being driven by PWM module 400 may vary based upon their operating conditions (e.g., switching times may be reduced as the operating current increases). In that case, the fractional dead time delays may be reduced as the switching performance of the connected transistors increases.

When the output signal from PWM timer 402 goes low, adder module 414 calculates the rising edge delay period to be ready to implement the delay when the rising edge is detected via the edge sync input at delay module 412. As such, adder module 414 receives as inputs the rising edge fractional delay 418 value and the rising edge dead-time fractional delay 424 as selected by switches 422 and 428, respectively. Adder module 414 then sums those values to calculate the delay to be supplied to delay module 412.

Figure 6:
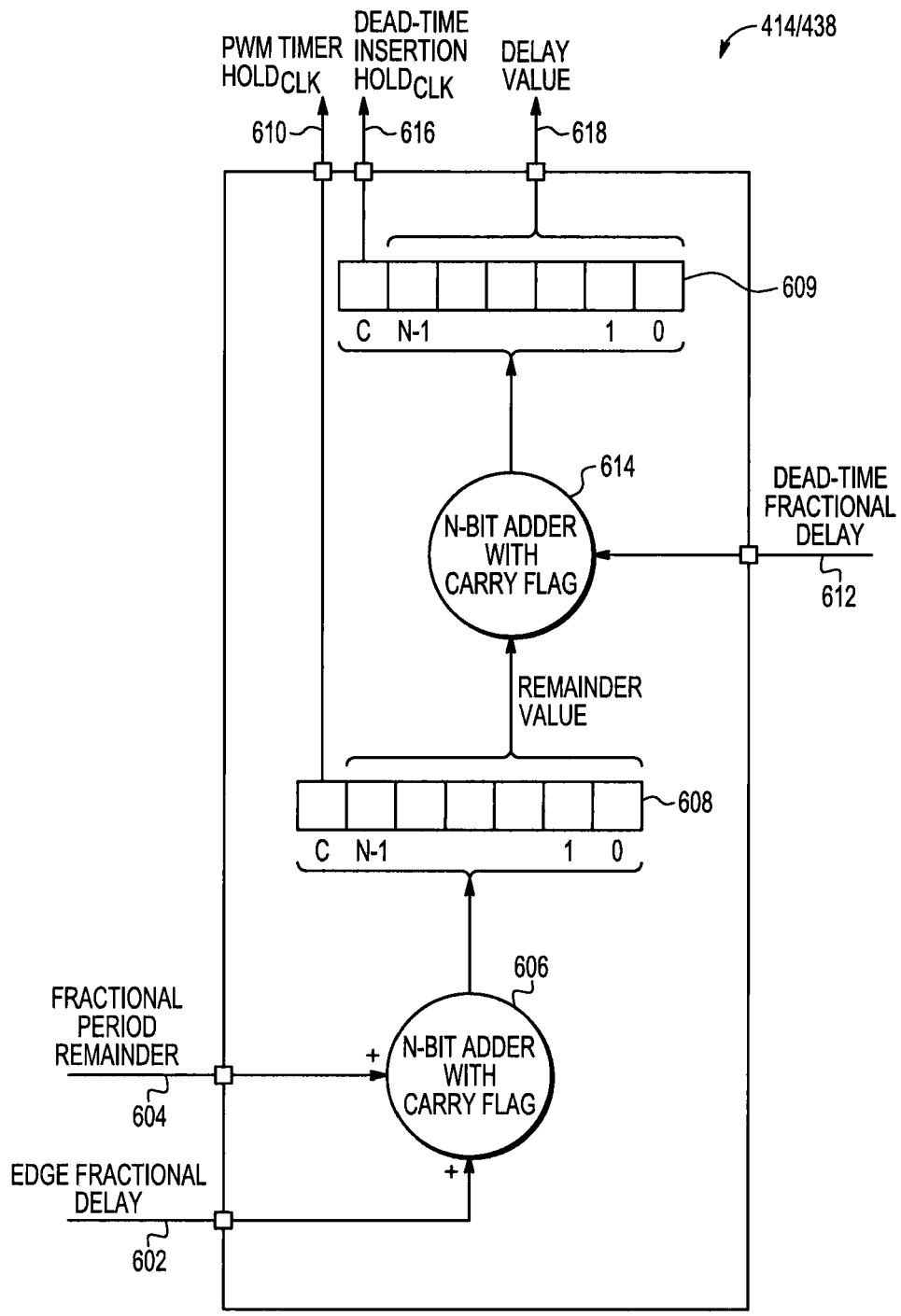
FIG. 6 is a block diagram of an N-bit adder configured to calculate a delay value.

FIG. 6 is a block diagram illustrating an example embodiment of adder module 414. At edge fractional delay input 602, adder module 414 receives a binary value representing the edge fractional delay (e.g., a value output by either elements 418 or 420 of FIG. 4). Adder module 414 also receives as an input a fractional delay period remainder at fractional remainder input 604. The fractional delay period remainder is a binary value representing the fractional clock cycle remaining from the previous PWM period.

At summing block 606, the two values are summed together to generate output value 608. If the sum of the two values results in the carry flag being set, that indicates that the sum of the fractional delay period remainder and the edge fractional delay period is greater than one clock cycle. If that is the case, adder module 414 generates a PWM Timer Hold$_{CLK}$ signal 610 that, with reference to FIG. 4, is supplied back to PWM timer 402 using timer hold clock line 415 as a Rising Edge PWM Timer Hold$_{CLK}$ signal. The Rising Edge PWM Timer Hold$_{CLK}$ signal, when asserted, causes the PWM timer 402 to delay the rising edge of its output for a clock cycle, thereby implementing a one clock cycle delay on the rising edge of the modulated waveform outputted by PWM timer 402. As indicated by switch 430, the Rising Edge PWM Timer Hold$_{CLK}$ signal is only supplied to PWM timer 402 when the output of PWM timer 402 is low and, as such, will only operate to delay the rising edge of the signal being outputted by PWM timer 402.

After summing the fractional delay period remainder and the edge fractional delay period in summing block 606, the remainder of the sum is added in summing block 614 to the dead time fractional delay received at input 612 to generate output value 609. If the sum of those values again results in the carry flag being set, adder module 414 generates a Dead Time Insertion Hold$_{CLK}$ signal 616 that, with reference to FIG. 4, is supplied back to insertion logic 410 using dead time insertion hold line 417. The Dead Time Insertion Hold$_{CLK}$ signal, when asserted, causes the insertion logic 410 to hold its output for a clock cycle, thereby implementing a one clock cycle delay on any dead time insertion performed by insertion logic 410.

Finally, the output value 609 is outputted by adder module 414 at output 618 and, with reference to FIG. 4, supplied to delay module 412. And, as described above, delay module 412 uses the delay value to implement a fractional delay upon detecting an edge in the output of insertion logic 410.

Returning to FIG. 4, when the output of insertion logic 410 is in a low state, adder module 414 begins summing the various delay values (fractional delay period remainder, fractional delay, and dead time fractional delay) to calculate the delay to be applied to the up-coming rising edge transition. If, while calculating that delay, any of the sums results in a carry flag being set, as described above, one or more of the PWM timer 402 and insertion logic 410 will be instructed to hold their outputs for a clock cycle. When delay module 412 detects an edge (in this case a rising edge) in the output signal from insertion logic 410, delay module 412 implements the delay as determined by the delay value received from adder module 414. This is reflected in the waveform 508 on FIG. 5. As shown, the rising edge of the output signal PWM_Top is delayed by both a fractional delay 510 (defined by element 418 of FIG. 4) and a fractional dead time delay 512 (defined by element 424 of FIG. 4).

Conversely, when the output of insertion logic 410 is in a high state, adder module 414 begins summing the fractional delay period remainder and fractional delay) to calculate the delay to be applied to the up-coming falling edge transition. For branch 404, insertion logic 410 only inserts the dead-time fractional delay while the transition of its input is from low state to high state (rising edge). There is no dead-time insertion while the transition of its input is from high state to low (falling edge). When delay module 412 detects an edge (in this case a falling edge) in the output signal from insertion logic 410, delay module implements the delay as determined by the delay value received from adder module 414. This is reflected in the waveform 508 on FIG. 5. As shown, the falling edge of the output signal PWM_Top is delayed by fractional delay 514 (defined by element 420 of FIG. 4), but no fractional dead time delay (e.g., the falling edge dead-time fractional delay defined in element 426 of FIG. 4 is zero, in an embodiment).

Branch 406 of PWM module 400 operates includes analogous components and operates in a similar fashion to branch 404, but in a complimentary arrangement.

As illustrated by FIG. 4, however, the input signal MW$_{rough}$ to branch 406 is inverted by inverter 432 before being processed. Falling edge dead time insertion logic 434 is configured to detect the falling edge in the signal received from PWM timer 402 and insert a dead time delay. The dead time delay inserted by insertion logic 434 has a frequency resolution that is equal to that of the system clock. The output of insertion logic 434 is shown in FIG. 5 by waveform 518. As illustrated, the rising edges in waveform 518 are delayed by a fixed number of system clock cycles (in this example, 1 whole clock cycle). In addition to the whole-clock cycle delay introduced by insertion logic 434, however, branch 406 includes delay module 436, which is configured to add fractional delays to the signal received from insertion logic 434. In one embodiment, delay module 436 is configured as illustrated by delay module 340 shown in FIG. 3. Delay module 436 receives as an input a binary value from adder module 438 (which is analogous to the input 356 shown in FIG. 3). Delay module 436 also has an edge sync input enabling delay module 436 to detect edges in the signal outputted by insertion logic 434 and delay those edges by a fractional period.

Specifically, before an edge is detected, delay module 436 supplies a low value to the clock input of flip-flop 440 (which is analogous to the flip-flop 330 shown in FIG. 3), causing the output Q of flip-flop 440 to stay unchanged. When an edge is detected, delay module 436 executes a delay of a period determined by the value received from adder module 438. After that fractional delay period has expired, delay module 436 outputs a high value to the clock input of flip-flop 440 allowing the output Q of flip-flop 440 to change, representing a delay of the output of insertion logic 434. Because the delay value received from adder module 438 specifies a fractional delay, delay module 436 operates to impose a sub-clock-cycle delay to the signal received from insertion logic 434.

The delay value generated by adder module 438 is determined by a number of input values including an edge fractional delay, a dead time fractional delay, and a remainder from a previous delay. The input values are each specified as binary values having N-bits. In the present embodiment, different fractional delays and dead time fractional delays may be specified depending upon whether the PWM signal received from PWM timer 402 is at a rising or a falling edge.

In the example shown in FIG. 4, two different fractional delays 442 and 444 are defined for whether the PWM signal is at a falling edge or a rising edge, respectively. Similarly, two different fractional dead time delays 446 and 448 are defined for whether the PWM signal is at a falling edge or a rising edge, respectively. These delays are generally defined as binary values having N bits. The delays may be stored in registers or other memory structures accessible to PWM module 400. The delay values may be static or may be dynamic, varying in accordance with the operating conditions of PWM module 400. For example, the performance of transistors being driven by PWM module 400 may vary based upon their operating conditions (e.g., switching times may be reduced as the operating current increases). In that case, the fractional dead time delays may be reduced as the switching performance of the connected transistors increases.

When the output signal from PWM timer 402 is high, adder module 438 calculates the falling edge delay period to be ready to implement the delay when the falling edge is detected via the edge sync input at delay module 436. As such, adder module 438 receives as inputs the falling edge fractional delay 442 value and the falling edge dead-time fractional delay 446 as selected by switches 450 and 452, respectively. Adder module 438 then sums those values to calculate the delay to be supplied to delay module 436.

FIG. 6 is a block diagram illustrating an example embodiment of adder module 438. At edge fractional delay input 602, adder module 438 receives a binary value representing the edge fractional delay (e.g., a value output by either elements 442 or 444 of FIG. 4). Adder module 438 also receives as an input a fractional delay period remainder at fractional remainder input 604. The fractional delay period remainder is a binary value representing the fractional clock cycle remaining from the previous PWM period.

At summing block 606, the two values are summed together to generate output value 608. If the sum of the two values results in the carry flag being set, that indicates that the sum of the fractional delay period remainder and the edge fractional delay period is greater than one clock cycle. If that is the case, adder module 438 generates a PWM Timer Hold$_{CLK}$ signal 610 that, with reference to FIG. 4, is supplied back to PWM timer 402 using timer hold clock line 454 in the form of a Falling Edge PWM Timer Hold$_{CLK}$ signal. The Falling Edge PWM Timer Hold$_{CLK}$ signal, when asserted, causes the PWM timer 402 to delay the falling edge of its output for a clock cycle, thereby implementing a one clock cycle delay on the falling edge of the modulated waveform outputted by PWM timer 402. As indicated by switch 456, the Falling Edge PWM Timer Hold$_{CLK}$ signal is only supplied to PWM timer 402 when the output of PWM timer 402 is high and, as such, will only operate to delay the falling edge of the signal being outputted by PWM timer 402.

After summing the fractional delay period remainder and the edge fractional delay period in summing block 608, the remainder of the sum is added by summing block 614 to the dead time fractional delay received at input 612 to generate output value 609. If the sum of those values again results in the carry flag being set, adder module 438 generates a Dead Time Insertion Hold$_{CLK}$ signal 616 that, with reference to FIG. 4, is supplied back to insertion logic 434 using dead time insertion hold line 458. The Dead Time Insertion Hold$_{CLK}$ signal, when asserted, causes the insertion logic 434 to hold its output for a clock cycle, thereby implementing a one clock cycle delay on any dead time insertion performed by insertion logic 434.

Finally, the output value 614 is outputted by adder module 438 at output 618 and, with reference to FIG. 4, supplied to delay module 436. And, as described above, delay module 436 uses the delay value to implement a fractional delay upon detecting an edge in the output of insertion logic 434.

Returning to FIG. 4, when the output of insertion logic 434 is in a high state, adder module 438 begins summing fractional delay period remainder and fractional delay to calculate the delay to be applied to the up-coming falling edge transition. In one embodiment, rising edge dead-time fractional delay 448 is equal to zero and will not be summed, though in other embodiments, a rising edge dead-time fractional delay 448 may be defined and summed by adder module 438. For branch 406, insertion logic 434 only inserts dead-time while the transition of the output from PWM timer 402 goes from low state to high state (rising edge). There is no dead-time insertion while the transition of the output from PWM timer 402 goes from high state to low (falling edge). When delay module 436 detects an edge (in this case a falling edge) in the output signal from insertion logic 434, delay module 436 implements the delay as determined by the delay value received from adder module 438. This is reflected in the waveform 520 on FIG. 5. As shown, the rising edge of the output signal PWM_Bottom is delayed by both a fractional delay 522 (defined by element 442 of FIG. 4) and a fractional dead time delay 524 (defined by element 446 of FIG. 4).

In one embodiment, a device includes a timer configured to generate a first modulated waveform signal, and an adder module configured to calculate a delay. The delay includes at least one of an edge fractional delay and a dead time fractional delay. The device includes a delay module operably coupled to the timer and the adder module. The delay module is configured to delay at least one of a rising edge of the first modulated waveform signal and a falling edge of the first modulated waveform signal by the delay to generate a second modulated waveform signal that has a higher frequency resolution than a frequency resolution of the first modulated waveform signal.

In another embodiment, a method includes receiving a first modulated waveform signal, and calculating a delay. The delay includes at least one of an edge fractional delay and a dead time fractional delay. The method includes generating a second modulated waveform signal by delaying at least one of a rising edge of the first modulated waveform signal and a falling edge of the first modulated waveform signal by the delay. The second modulated waveform signal has a higher frequency resolution than a frequency resolution of the first modulated waveform signal.

In another embodiment, a non-transient computer readable medium includes computer program instructions for causing a processor to perform receiving a first modulated waveform signal, and calculating a delay. The delay includes at least one of an edge fractional delay and a dead time fractional delay. The non-transient computer readable medium includes computer program instructions for causing a processor to perform generating a second modulated waveform signal by delaying at least one of a rising edge of the first modulated waveform signal and a falling edge of the first modulated waveform signal by the delay. The second modulated waveform signal has a higher frequency resolution than a frequency resolution of the first modulated waveform signal.

The delay logic according to any of the examples described herein, may be implemented using any suitable hardware and/or software components. For example the delay logic may comprise gate propagation delays, charging capacitors or the like, configurable and/or controllable by way of hardware or software control logic. For example, the delay logic may comprise one or more adder circuits arranged to configure hardware components, for example in the form of gate propagation delays, charging capacitors or the like, to delay the rising and falling edges of the modulated waveform signal generated by the timer logic.

Alternatively, examples of the invention may be implemented in a computer program for execution by, for example, a microprocessor of the semiconductor device comprising the delay logic, at least including code portions for performing steps of a method according to the invention when run on the microprocessor or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, stored with data loadable in a memory of a computer system, the data representing the computer program. The data carrier may comprise, by way of example, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory.

In the foregoing specification, the invention has been described with reference to specific examples of embodiments of the invention. It will, however, be evident that various modifications and changes may be made therein without departing from the scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

Because the apparatus implementing embodiments of the invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the examples of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively associated such that the desired functionality is achieved. Hence, any two components herein combined to achieve a particular functionality can be seen as associated with each other such that the desired functionality is achieved, irrespective of architectures or intermediary components. Likewise, any two components so associated can also be viewed as being operably connected, or operably coupled, to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

What is claimed is:

1. A device, comprising:
   a timer configured to generate a first modulated waveform signal;
   an adder module configured to calculate a delay, wherein the delay includes at least one of an edge fractional delay and a dead time fractional delay; and
   a delay module operably coupled to the timer and the adder module, the delay module being configured to delay at least one of a rising edge of the first modulated waveform signal and a falling edge of the first modulated waveform signal by the delay to generate a second modulated waveform signal that has a higher frequency resolution than a frequency resolution of the first modulated waveform signal.

2. The device of claim 1, wherein the delay module includes a delay locked loop.

3. The device of claim 1, wherein the adder module includes a timer hold clock line coupled to the timer and configured to enable the adder module to cause the timer to delay an edge of the first modulated waveform signal.

4. The device of claim 3, wherein, when a result of calculating the delay results in a carry bit and the delay includes the edge fractional delay, the adder module is configured to use the timer hold clock line to delay the edge of the first modulated waveform signal.

5. The device of claim 1, including dead time insertion logic configured to add a whole-clock cycle dead time delay to the first modulated waveform signal.

6. The device of claim 5, wherein the adder module includes a dead time insertion hold line coupled to the dead time insertion logic and configured to enable the adder module to cause the dead time insertion logic to delay the addition of the whole-clock-cycle dead time delay to the first modulated waveform signal.

7. The device of claim 6, wherein, when a result of calculating the delay results in a carry bit and the delay includes the dead time fractional delay, the adder module is configured to use the dead time insertion hold line to delay the addition of the whole-clock-cycle dead time delay to the first modulated waveform signal.

8. The device of claim 1, wherein the delay modules includes an edge sync input to detect edges in the first modulated waveform signal.

9. The device of claim 1, wherein the edge fractional delay and the dead time fractional delay are stored in registers accessible to the adder module.

10. The device of claim 1, wherein the edge fractional delay and the dead time fractional delay are defined by N-bit binary values.

11. The device of claim 1, wherein the second modulated waveform signal has a higher pulse width resolution than a pulse width resolution of the first modulated waveform signal generated by the timer.

12. A method, comprising:
receiving a first modulated waveform signal;
calculating a delay, wherein the delay includes at least one of an edge fractional delay and a dead time fractional delay; and
generating a second modulated waveform signal by delaying at least one of a rising edge of the first modulated waveform signal and a falling edge of the first modulated waveform signal by the delay, wherein the second modulated waveform signal has a higher frequency resolution than a frequency resolution of the first modulated waveform signal.

13. The method of claim 12, including, when a result of calculating the delay results in a carry bit and the delay includes the edge fractional delay, delaying the edge of the first modulated waveform signal.

14. The method of claim 12, including adding a whole-clock cycle dead time delay to the first modulated waveform signal.

15. The method of claim 14 including, when a result of calculating the delay results in a carry bit and the delay includes the dead time fractional delay, delaying the addition of the whole-clock-cycle dead time delay to the first modulated waveform signal.

16. A non-transient computer readable medium comprising computer program instructions for causing a processor to perform:
receiving a first modulated waveform signal;
calculating a delay, wherein the delay includes at least one of an edge fractional delay and a dead time fractional delay; and
generating a second modulated waveform signal by delaying at least one of a rising edge of the first modulated waveform signal and a falling edge of the first modulated waveform signal by the delay, wherein the second modulated waveform signal has a higher frequency resolution than a frequency resolution of the first modulated waveform signal.

17. The non-transient computer readable medium of claim 16, wherein the code is operable for, when a result of calculating the delay results in a carry bit and the delay includes the edge fractional delay, delaying the edge of the first modulated waveform signal.

18. The non-transient computer readable medium of claim 16, wherein the code is operable for adding a whole-clock cycle dead time delay to the first modulated waveform signal.

19. The non-transient computer readable medium of claim 18 wherein the code is operable for, when a result of calculating the delay results in a carry bit and the delay includes the dead time fractional delay, delaying the addition of the whole-clock-cycle dead time delay to the first modulated waveform signal.

20. The non-transient computer readable medium of claim 16, wherein the computer readable storage medium comprises at least one of a hard disk, a CD-ROM, an optical storage device, a magnetic storage device, a ROM (Read Only Memory), a PROM (Programmable Read Only Memory), a EPROM (Erasable Programmable Read Only Memory), a EEPROM (Electrically Erasable Programmable Read Only Memory) and a Flash memory.

* * * * *